(12) United States Patent
Sakata et al.

(10) Patent No.: US 7,286,072 B2
(45) Date of Patent: Oct. 23, 2007

(54) ANALOG-TO DIGITAL CONVERTER AND ANALOG-TO DIGITAL CONVERSION APPARATUS

(75) Inventors: Kohji Sakata, Gifu (JP); Seiichi Banba, Ohgaki (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/354,245

(22) Filed: Feb. 15, 2006

(65) Prior Publication Data

US 2006/0187105 A1 Aug. 24, 2006

(30) Foreign Application Priority Data

| Feb. 15, 2005 | (JP) | ............................. 2005-038385 |
| Jun. 30, 2005 | (JP) | ............................. 2005-192344 |
| Jan. 31, 2006 | (JP) | ............................. 2006-023706 |

(51) Int. Cl.
  *H03M 1/12* (2006.01)
(52) U.S. Cl. ...................... 341/155; 341/120
(58) Field of Classification Search ................ 341/155, 341/120, 158, 161, 159
See application file for complete search history.

(56) References Cited

U.S. PATENT DOCUMENTS

| 4,417,233 | A | * | 11/1983 | Inoue et al. ................. 341/156 |
| 4,686,508 | A | * | 8/1987 | van de Grift et al. ...... 341/159 |
| 5,781,132 | A | * | 7/1998 | Lewyn ........................ 341/159 |
| 6,002,356 | A | * | 12/1999 | Cooper ........................ 341/160 |
| 6,081,219 | A | * | 6/2000 | Prasanna ..................... 341/159 |
| 6,734,817 | B2 | * | 5/2004 | Naka et al. .................. 341/155 |
| 6,880,262 | B1 | * | 4/2005 | Jensen ........................ 341/155 |
| 7,102,559 | B2 | * | 9/2006 | Van Tuijl ..................... 341/156 |

FOREIGN PATENT DOCUMENTS

| JP | 2003-101411 | 4/2003 |
| JP | 2003-198368 | 7/2003 |

* cited by examiner

*Primary Examiner*—Peguy JeanPierre
(74) *Attorney, Agent, or Firm*—McDermott Will & Emery LLP

(57) ABSTRACT

An analog-to-digital conversion apparatus which has a variable resolution and allows a reduction in power consumption. This apparatus comprises an analog-to-digital converter (ADC) of parallel type, a controller, and an interpolation circuit. The analog-to-digital converter has a plurality of comparators connected in parallel, each for comparing potentials of an analog input signal and a reference signal. The controller generates a control signal for controlling the resolution of the analog-to-digital converter. Specifically, the controller controls the number of comparators (CMP) to operate by means of the control signal, thereby determining the resolution. The interpolation circuit interpolates the output data of the comparators that are disabled depending on the resolution. The controller avoids simultaneous operation of two adjoining comparators when the analog-to-digital converter is operated at a resolution lower than its maximum resolution.

7 Claims, 19 Drawing Sheets

FIG.4

| RESOLUTION | S1 | S2 |
|---|---|---|
| 3 BITS | 1 | 1 |
| 2 BITS | 0 | 1 |
| 1 BIT | 0 | 0 |

FIG.6

| AND01 | AND02 | AND03 | AND04 | AND05 | AND06 | AND07 | ENCODER OUTPUT (3 BITS) |
|---|---|---|---|---|---|---|---|
| 0 | 0 | 0 | 0 | 0 | 0 | 0 | 000 |
| 1 | 0 | 0 | 0 | 0 | 0 | 0 | 001 |
| 0 | 1 | 0 | 0 | 0 | 0 | 0 | 010 |
| 0 | 0 | 1 | 0 | 0 | 0 | 0 | 011 |
| 0 | 0 | 0 | 1 | 0 | 0 | 0 | 100 |
| 0 | 0 | 0 | 0 | 1 | 0 | 0 | 101 |
| 0 | 0 | 0 | 0 | 0 | 1 | 0 | 110 |
| 0 | 0 | 0 | 0 | 0 | 0 | 1 | 111 |

_US 7,286,072 B2_

ANALOG-TO DIGITAL CONVERTER AND ANALOG-TO DIGITAL CONVERSION APPARATUS

BACKGROUND OF THE INVENTION

1. Field of the Invention

The invention relates to analog-to-digital conversion technologies.

2. Description of the Related Art

Information communication terminals such as cellular phones are equipped with analog-to-digital converters for converting analog signals received from wired or wireless communication lines into digital signals. Information communication terminals are powered by batteries, and technologies for lower power consumption have been intensively developed in recent years.

In some radio communication techniques, modulation schemes are switched depending on changes in the environment. In such radio communications, resolutions required of analog-to-digital converters vary with the modulation schemes. Even with a fixed modulation scheme, the resolutions required of analog-to-digital converters also vary depending on signal, noise, and other conditions. Consequently, when analog-to-digital converters are given a fixed resolution, they can sometimes operate with performance higher than required, wasting power uselessly. For example, Japanese Patent Laid-Open Publication No. 2003-198368 has proposed an analog-to-digital converter which controls its power consumption to change performance.

Nevertheless, when a variable current source is used to adjust the amount of the current supplied to a preamplifier of the analog-to-digital converter, the adjustable range is narrow since the MOS transistors in the current mirror circuit must stay in their saturation regions. Considering the tendency toward lower power consumption and the future trend toward lower device voltages, the adjustable range will become even narrower. With increasing speedup, the power consumption of digital blocks within an analog-to-digital conversion apparatus, including a clock tree, becomes higher in proportion than that of the constant current passed through the preamplifier.

SUMMARY OF THE INVENTION

The present invention has been achieved in view of the foregoing. It is thus an object of the present invention to provide an analog-to-digital converter and conversion apparatus which have variable resolution and can achieve a reduction in power consumption.

To solve the foregoing problems, one of the aspects of the present invention provides an analog-to-digital converter. The analog-to-digital converter according to this aspect is of parallel type, comprising a plurality of comparators connected in parallel, each for comparing potentials of an analog input signal and a reference signal. Here, the number of comparators to operate is changed by an external control signal, thereby varying resolution.

According to the analog-to-digital converter of this aspect, the number of parallel-connected comparators to operate can be changed to vary the resolution and reduce the power consumption as well.

Another aspect of the present invention is an analog-to-digital conversion apparatus. This analog-to-digital conversion apparatus comprises: an analog-to-digital converter having a plurality of comparators connected in parallel, each for comparing potentials of an analog input signal and a reference signal; and a controller for generating a control signal for controlling resolution of the analog-to-digital converter.

According to the analog-to-digital conversion apparatus of this aspect, the number of comparators to operate can be changed to vary the resolution and reduce the power consumption as well.

Yet another aspect of the present invention relates to an analog-to-digital conversion apparatus. This analog-to-digital conversion apparatus is one for converting an analog signal into a digital signal through at least two functional blocks, being configured so that the functional blocks make a pipeline operation, the apparatus comprising a clock control unit which adjusts skews of clocks to be supplied to the respective functional blocks based on an S/N ratio of the digital signal converted by the analog-to-digital conversion apparatus.

BRIEF DESCRIPTION OF THE DRAWINGS

FIG. 4 is a diagram showing the relationship between required resolution and control signals of the analog-to-digital conversion apparatus;

FIG. 6 is a diagram showing an encoding table to be used in an encoder;

DETAILED DESCRIPTION OF THE INVENTION

FIRST EMBODIMENT

Figure 1:
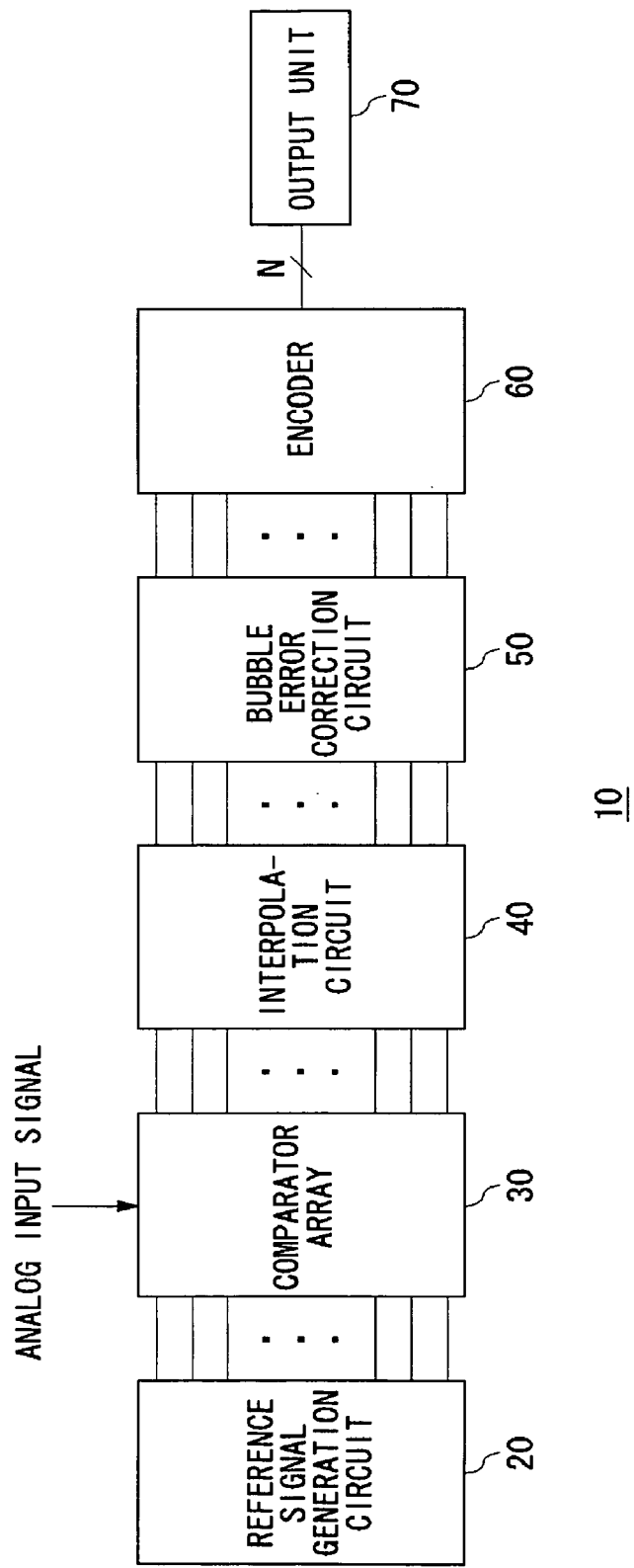
FIG. 1 is a diagram showing the configuration of an analog-to-digital converter according to a first embodiment of the present invention.

FIG. 1 shows the configuration of an analog-to-digital converter according to a first embodiment of the present invention. The analog-to-digital converter 10 according to the first embodiment is configured as an analog-to-digital converter of parallel type which realizes high-speed operations by using a plurality of comparators arranged in parallel. The analog-to-digital converter 10 comprises a reference signal generation circuit 20, a comparator array 30, an interpolation circuit 40, a bubble error correction circuit 50, an encoder 60, and an output unit 70.

The reference signal generation circuit 20 comprises a plurality of reference resistors connected in series. All the resistors have the same resistance. When a voltage is applied to across the reference resistors connected in series, the reference signal generation circuit 20 generates a plurality of reference signals which have predetermined differences in level resulting from voltage drops by the respective reference resistors.

The comparator array 30 comprises a plurality of comparators connected in parallel. The plurality of comparators receive the reference signals generated by the reference signal generation circuit 20, respectively, at either one of their input terminals each. The other input terminals of the comparators receive an analog input signal. The comparators compare the potentials of the analog input signal and the reference signals. The comparators output a logical value "1" if the analog input signal is higher in potential, and output a logical value "0" if the reference signals are higher in potential. The analog-to-digital converter 10 converts the analog input signal into a digital signal by identifying at which comparator the output values change over.

In the analog-to-digital converter 10 according to the first embodiment, the number of comparators to operate is changed by an external control signal, thereby varying the resolution. In the comparator array 30, the comparators are controlled in operation, whether operable or not, by means of clocks. Comparators selected as operable are supplied with clocks having the same frequency as that of an external clock. Unselected comparators are supplied with a DC potential. This DC potential functions as a disable signal for stopping the operation of the comparators.

Given a maximum resolution of N bits, the comparator array 30 comprises $2^N-1$ comparators. The comparator array 30 outputs a thermometer code. The thermometer code refers to a code such as follows: Logical values "1" are output successively from comparators that receive the reference signals of lowest potentials. The logical values change over at a comparator in an intermediate stage. Then, logical values "0" are output successively from up to the comparator that receives the reference signal of the highest potential. Incidentally, the thermometer code also covers the cases where all the output values of the comparators are 0 or 1.

Suppose that a resolution of $1/2^X$ the maximum resolution (X is a natural number), i.e., a resolution of (N−X) bits is required. To output a thermometer code, the comparator array 30 operates the $(2^X \times m)$-th comparators alone (m is natural numbers, where $2^X \times m < 2^N-1$) as viewed from the comparator that receives the reference signal of the lowest potential (i.e., the least significant bit of the comparator array 30). The clocks to be input to the other comparators are suspended. When the analog-to-digital converter 10 is thus operated at a resolution lower than the maximum resolution, the operation of the comparators is controlled so that adjoining comparators will not operate simultaneously. Incidentally, adjoining comparators shall refer to two comparators that receive reference voltages having a difference as much as a single stage of reference resistor. Since the comparators whose clock inputs are suspended become unsteady in output, the data is interpolated by the interpolation circuit 40 in the subsequent stage.

The interpolation circuit 40 interpolates the thermometer code data output from the comparator array 30 in accordance with the required resolution. Specifically, the interpolation circuit 40 interpolates the output data of the comparators that are disabled according to the resolution. In the first embodiment, the output data of the comparators lying between the $(2^X \times m)$-th comparators and the $(2^X \times (m-1))$-th comparators of the comparator array 30, as viewed from the comparator that receives the reference signal of the lowest potential, is interpolated by using the output data of the $(2^X \times m)$-th comparators. This interpolation processing is performed by replacing the output data of the comparators lying between the $(2^X \times m)$-th comparators and the $(2^X \times (m-1))$-th comparators as viewed from the least significant bit of the comparator array 30 with the output data of the $(2^X \times m)$-th comparators.

The bubble error correction circuit 50 corrects bubble errors occurring in the interpolated thermometer code data output from the interpolation circuit 40. Bubble errors refer to errors such that bit values that are supposed to be continuous are output without continuity. The encoder 60 encodes the data given the bubble error correction, and outputs N bits of data to the output unit 70.

Figure 2:
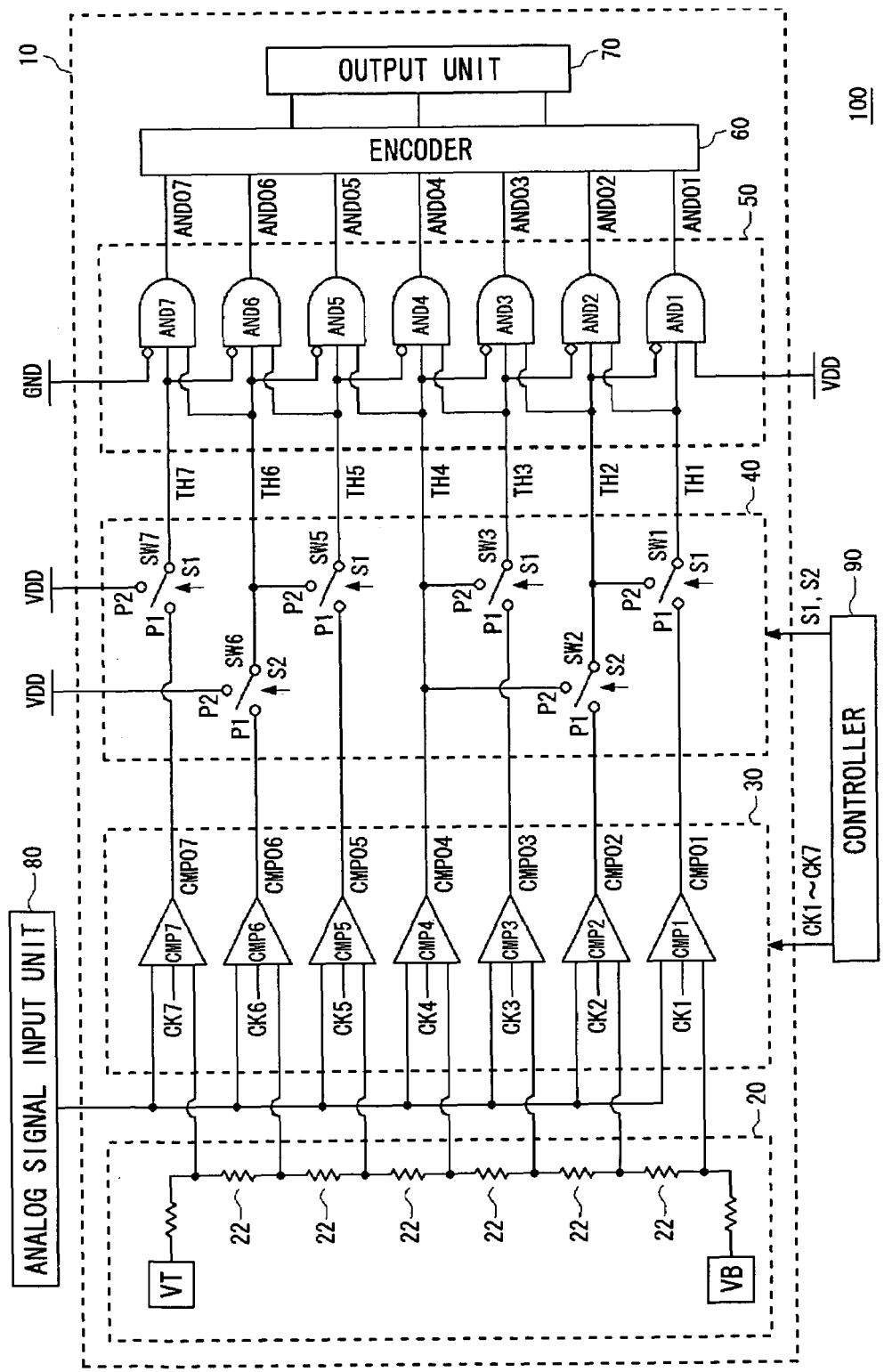
FIG. 2 is a diagram showing the configuration of an analog-to-digital conversion apparatus according to the first embodiment of the present invention.

FIG. 2 shows the configuration of an analog-to-digital conversion apparatus according to the first embodiment of the present invention. The analog-to-digital conversion apparatus 100 according to the first embodiment comprises an analog signal input unit 80, the analog-to-digital converter 10, and a controller 90. The analog signal input unit 80 supplies an analog input signal. The analog-to-digital converter 10 has a plurality of comparators connected in parallel, each for comparing the analog input signal and a reference signal. The controller 90 generates control signals for controlling the resolution of the analog-to-digital converter 10.

The reference signal generation circuit 20 has a plurality of reference resistors 22 connected in series, having the same resistances. The ends of the series of resistors are connected to potentials VB and VT. The outputs of the respective reference resistors are input to input terminals of the respective comparators (hereinafter, also referred to as "CMP") in the comparator array 30. The analog-to-digital converter 10 shown in FIG. 2 has a maximum resolution of three bits, and thus has seven ($=2^3-1$) comparators connected in parallel.

In the analog-to-digital converter 10 of FIG. 2, the comparator that receives the reference signal of the lowest potential will be referred to as CMP1, the comparator that receives the reference signal of the second lowest potential as CMP2, and the comparator of the third lowest potential as CMP3. The subsequent comparators will be given symbols in the same manner, so that the comparator that receives the reference signal of the highest potential will be referred to as CMP7. Moreover, the output of CMP1 will be referred to as CMPO1, the output of CMP2 as CMPO2, the output of CMP3 as CMPO3, the output of CMP4 as CMPO4, the output of CMP5 as CMPO5, the output of CMP6 as CMPO6, and the output of CMP7 as CMPO7. Incidentally, CMPO1 may also be referred to as the least significant bit of the comparator array 30, and CMPO7 as the most significant bit of the same. Each CMPi (i is a natural number of 1 to 7) compares the potentials of the analog input signal supplied from the analog signal input unit 80 and a reference signal supplied from the reference signal generation unit 20 when the clock CKi (i is a natural number of 1 to 7) input thereto is enabled. When the clock CKi input thereto is a disable signal, CMPi makes no comparison processing.

The interpolation circuit 40 comprises a plurality of switches (SW). Here, six switches SW1, SW2, SW3, SW5, SW6, and SW7 are provided. Each of the switches is driven by a control signal S1 or S2 which is supplied from the controller 90. Each switch has contacts P1 and P2, and establishes connection to the contact P1 when the control signal shows a logical value "1," and to the contact P2 when the control signal shows a logical value "0." The controller 90 generates the control signals S1 and S2, and supplies the same to the switches of the interpolation circuit 40. The controller 90 also generates the clocks CKi (i is natural numbers of 1 to 7) from the control signals S1 and S2, and supplies the same to CMPs in the comparator array 30.

Figure 3:
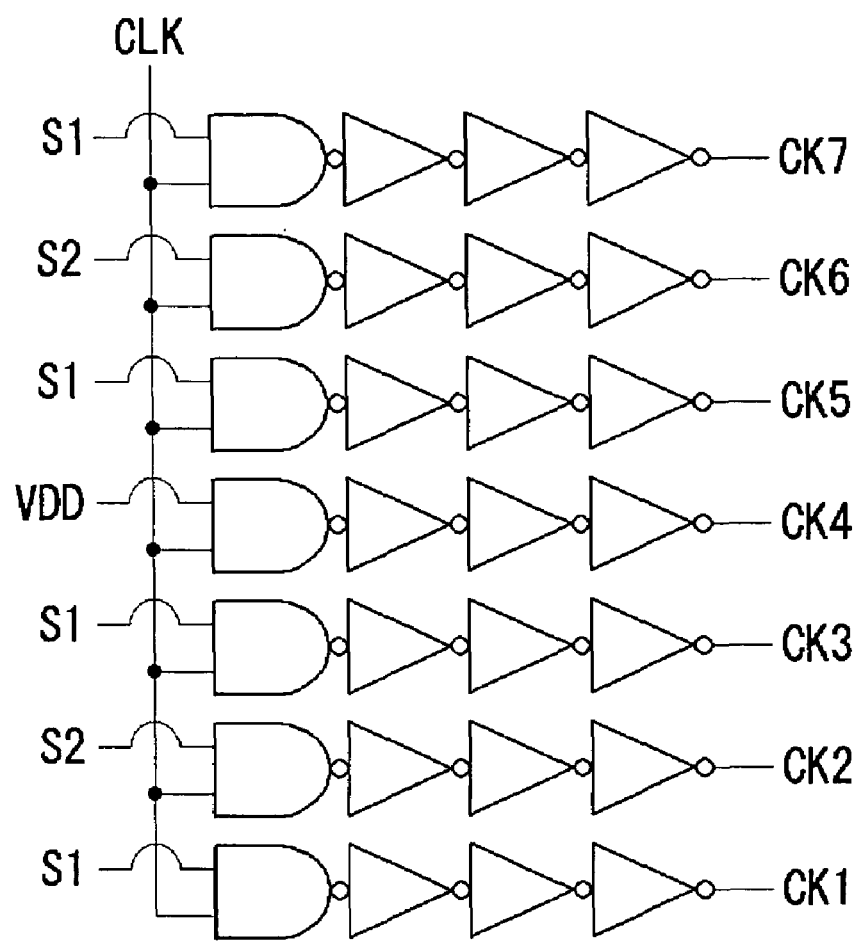
FIG. 3 is a diagram showing the configuration of a clock tree in a controller.

FIG. 3 shows the configuration of a clock tree in the controller 90. The clock tree 92 is composed of seven AND circuits connected in parallel. The AND circuits receive a system-driving clock CLK at either one of their input terminals each. The central AND circuit receives a VDD potential at the other input terminal, so that CK4 has the same waveform as that of the clock CLK. Meanwhile, the even-numbered AND circuits as viewed from the bottom (excluding the central AND circuit) receive the control signal S2. The odd-numbered AND circuits receive the control signal S1.

Figure 4:
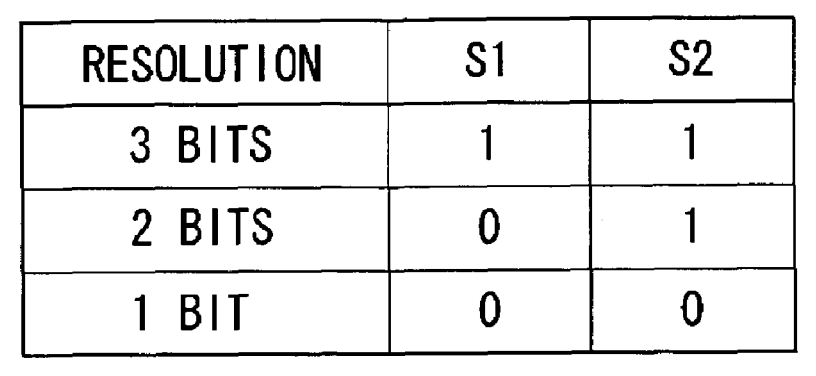

FIG. 4 shows the relationship between the required resolution and the control signals of the analog-to-digital conversion apparatus according to the first embodiment. When a resolution of three bits is required, the control signal S1 takes on a logical value "1" and the control signal S2 a logical value "1." When a resolution of two bits is required, the control signal S1 takes on a logical value "0" and the control signal S2 a logical value "1." When a resolution of one bit is required, both the control signals S and S2 take on a logical value "0."

Referring to FIGS. 3 and 4, when a resolution of three bits is required, both the control signals S1 and S2 take on a logical value "1" so that all the clocks CK1 to CK7 output from the clock tree 92 become identical to the clock CLK. As a result, CMP1 to CMP7 operate normally, and the analog-to-digital converter 10 functions as a 3-bit ADC.

When a resolution of two bits is required, the control signal S1 takes on a logical value "0" and the control signal S2 a logical value "1." In the clock tree 92, the outputs of the AND circuits that receive the control signal S1, i.e., CK1, CK3, CK5, and CK7 become disable signals, whereby CMP1, CMP3, CMP5, and CMP7 are disabled. As a result, only CMP2, CMP4, and CMP6 operate normally, and the analog-to-digital converter 10 internally functions as a 2-bit ADC. Now, when a resolution of one bit is required, both the control signals S1 and S2 take on a logical value "0." The outputs of the AND circuits that receive the control signals S1 and S2, i.e., CK1 to CK3 and CK5 to CK7 become disable signals, whereby CMP1 to CMP3 and CMP5 to CMP7 are disabled. As a result, CMP4 alone operates normally, and the analog-to-digital converter 10 internally functions as a 1-bit ADC.

Figure 5:
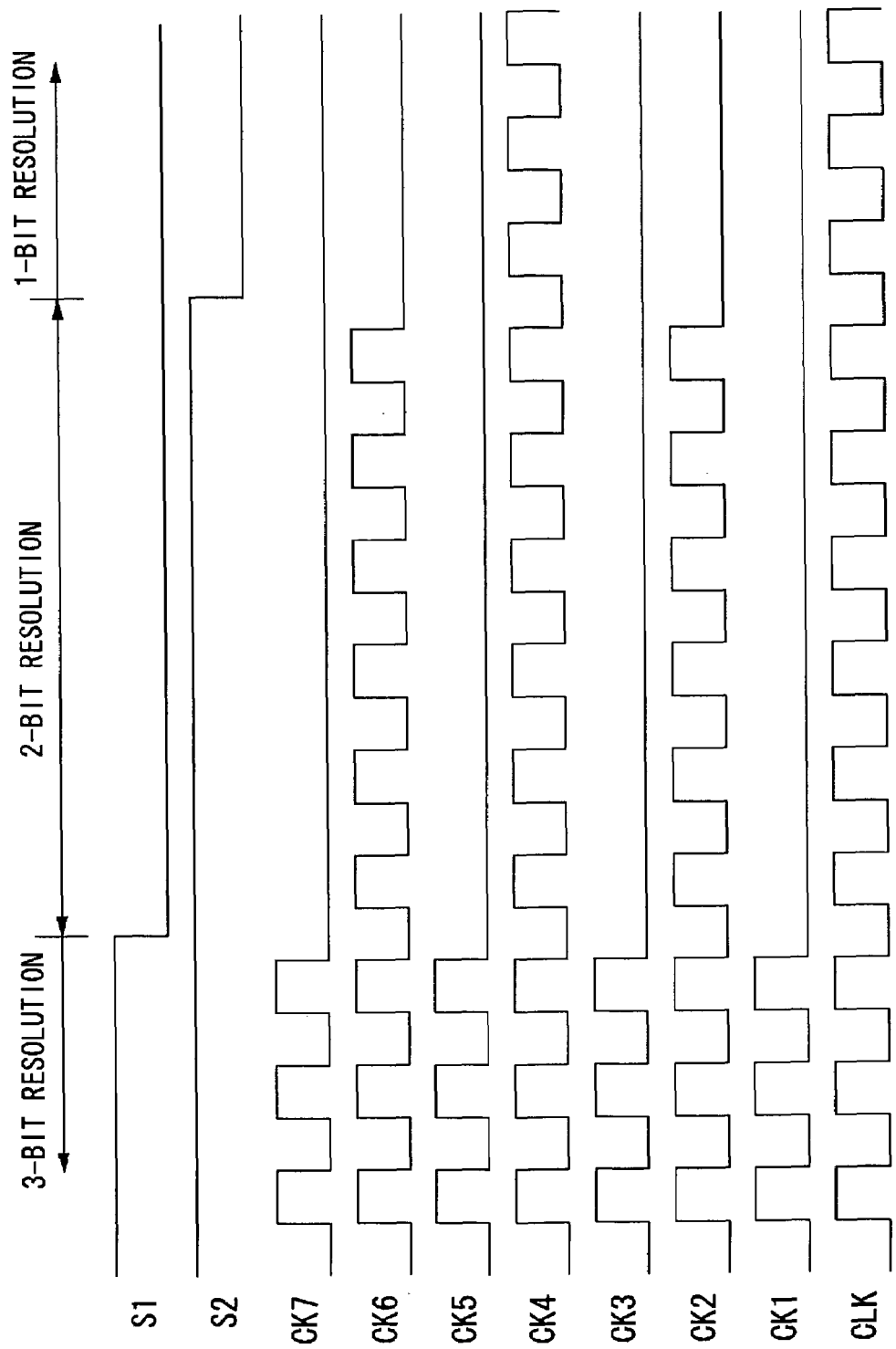
FIG. 5 is a timing chart showing the control signals and clocks CKi (i is natural numbers of 1 to 7) to be supplied to respective CMPs.

FIG. 5 shows timing charts of the control signals and the clocks CKi (i is natural numbers of 1 to 7) supplied to the respective CMPs. FIG. 5 shows three types of timing charts with internal resolutions of 3 bits, 2 bits, and 1 bit, respectively. CK1 to CK7 are generated by the clock tree 92 shown in FIG. 3 based on the relationship between the clock CLK and the control signals S1 and S2. Incidentally, while the analog-to-digital converter 10 according to the first embodiment changes its internal resolution by changing the number of comparators to operate, it also has the function of outputting data externally in as many bits as with the maximum resolution, i.e., in three bits. Consequently, external circuits for receiving the output data of the analog-to-digital converter 10 have only to wait for three bits of output data, which requires neither an adjustment to the number of bits of the output data nor a reception control in the external circuits.

The interpolation circuit 40 has the function of interpolating the output data of comparators that are disabled according to the resolution, and supplies the interpolated data TH1 to TH7 to the bubble error correction circuit 50. The bubble error correction circuit 50 has a plurality of AND circuits (AND1 to AND7), which receive TH1 to TH7 supplied from the interpolation circuit 40 and correct bubble errors. As a result of correction, only one of the AND circuits outputs a logical value "1," or otherwise all the AND circuits output a logical value "0."

FIG. 6 shows an encoding table to be used in the encoder. The output of AND1 will be referred to as ANDO1, the output of AND2 as ANDO2, the output of AND3 as ANDO3, the output of AND4 as ANDO4, the output of AND5 as ANDO5, the output of AND6 as ANDO6, and the output of AND7 as ANDO7. With reference to the encoding table, the encoder 60 obtains three bits of output value based on the seven bits ANDO1 to ANDO7. The three bits of output value are supplied to the output unit 70.

Initially, the operation of the analog-to-digital conversion apparatus 100 will be described for situation where three bits of resolution are required. The control unit 90 supplies the control signals S1 and S2 having a logical value "1" to the interpolation circuit 40. All the switches are connected to the contacts P1. As a result, CMPO1, CMPO2, CMPO3, CMPO4, CMPO5, CMPO6, and CMPO7 are transmitted to TH1, TH2, TH3, TH4, TH5, TH6, and TH7, respectively.

Suppose, for example, that CMPO1 to CMPO4 have a logical value "1" and CMPO5 to CMPO7 a logical value "0" as a result of comparison processing in the comparator array 30. Here, the output ANDO4 shows a logical value "1" while the rest of the AND circuits output a logical value "0." With reference to the encoding table shown in FIG. 6, the encoder 60 outputs "100."

Next, description will be given of the operation of the analog-to-digital conversion apparatus 100 for situations where two bits of resolution are required. The control unit 90 supplies the control signal S1 having a logical value "0" and the control signal having a logical value "1" to the interpolation circuit 40. SW1, SW3, SW5, and SW7 are connected to the contacts P2, and SW2 and SW4 are connected to the contacts P1. Since only CK2, CK4, and CK6 become enable signals, three comparators CMP2, CMP4, and CMP6 are in operation. As a result, CMPO2 is transmitted to TH1 and TH2, CMPO4 to TH3 and TH4, CMPO6 to TH5 and TH6, and the VDD potential to TH7. Incidentally, TH7 may be provided with a predetermined potential other than the VDD potential.

Take, for example, the case where CMPO2 and CMPO4 have a logical value "1" and CMPO6 a logical value "0." Here, the boundary between "1" and "0" of the thermometer code falls to between TH4 and TH6. Due to the connection of the individual SWs, TH1 to TH4 show a logical value "1" while TH5 and TH6 show a logical value "0." Since TH7 is supplied with the VDD potential, however, the thermometer code goes out of proper data arrangement. This deviation will be corrected by the bubble error correction circuit 50 in the subsequent stage.

When the data TH1 to TH7 is input to the bubble error correction circuit 50, AND4 outputs a logical value "1" while the rest of the AND circuits output a logical value "0." The bubble error correction circuit 50 can thus absorb bubble errors in the thermometer code of TH1 to TH7. With reference to the encoding table shown in FIG. 6, the encoder 60 outputs three bits "100."

Now, the operation of the analog-to-digital conversion apparatus 100 will be described further for situations where one bit of resolution is required. The control unit 90 supplies the control signals S1 and S2 having a logical value "0" to the interpolation circuit 40. The switches are connected to the contacts P2. Since CK4 only becomes an enable signal, a single comparator CMP4 alone is in operation. As a result, CMPO4 is transmitted to TH1 to TH4, and the VDD potential is transmitted to TH5 to TH7.

Take, for example, the case where CMPO4 has a logical value "1." Here, in the bubble error correction circuit 50, AND7 outputs a logical value "1" while the rest of the AND circuits output a logical value "0." With reference to the encoding table shown in FIG. 6, the encoder 60 outputs three bits "111."

As described above, the analog-to-digital conversion apparatus 100 according to the first embodiment can change its resolution in response to an external request, thereby realizing optimum power consumption during operation. Since the operation for changing the resolution is a low-speed operation, the additional circuit causes only a slight increase in power consumption. It is therefore possible to reduce the power consumption of the entire system effectively.

With a further speedup, the clock tree 92 grows in power consumption. Effective use can thus be made of the analog-to-digital conversion apparatus 100 according to the first embodiment. Moreover, unlike a constant current control on the comparators, the ratio of reduction of the power consumption is unchanged even if voltage reductions proceed further. This allows a high effect even for miniaturization.

Figure 7:
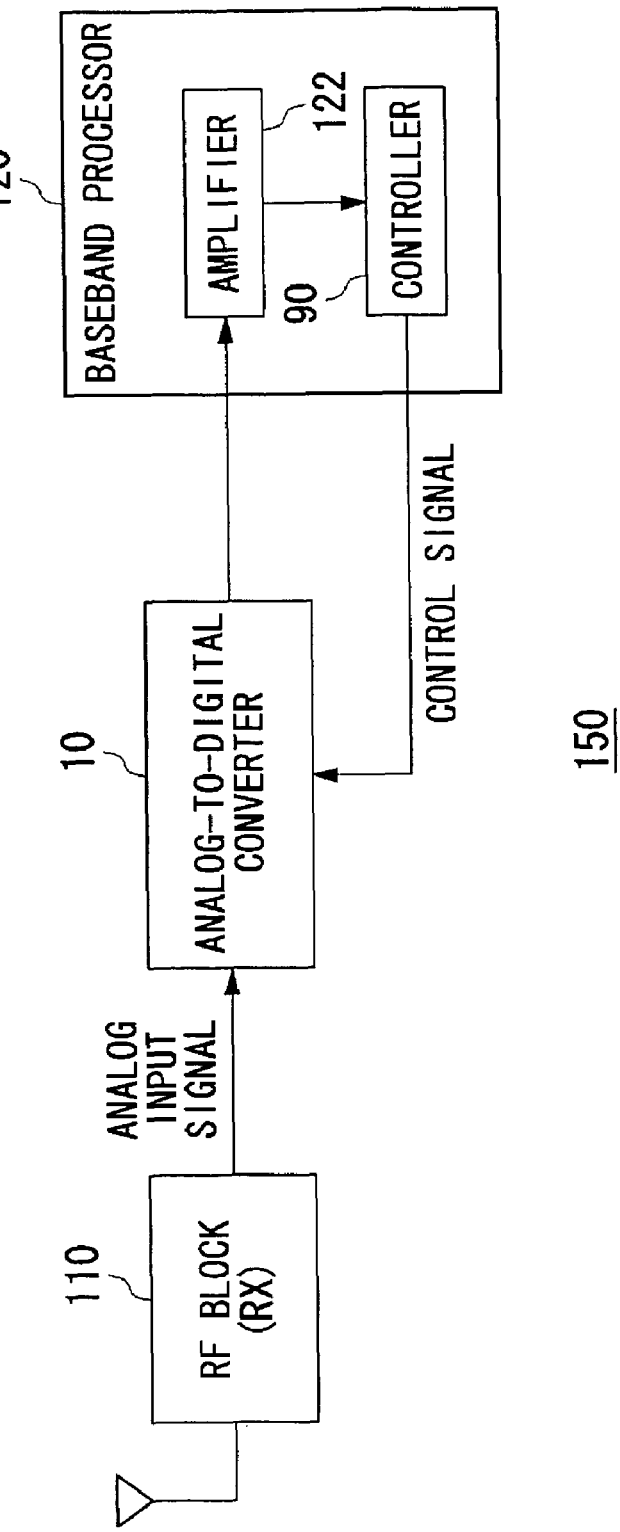
FIG. 7 is a diagram showing the configuration of the receiving side of a radio communication apparatus in which the analog-to-digital converter is incorporated.

FIG. 7 shows the configuration of the receiving side of a radio communication apparatus in which the analog-to-digital converter according to the first embodiment is incorporated. The radio communication apparatus 150 comprises a receiving-side RF block 110, the analog-to-digital converter 10, and a baseband processor 120. The RF block 110 receives a radio communication signal from the antenna, and supplies an analog input signal to the analog-to-digital converter 10. The output of the analog-to-digital converter 10 is transmitted to an amplifier 122 in the baseband processor 120, and the output of the amplifier 122 is transmitted to a controller 90. The controller 90 calculates an S/N ratio from the amplifier output, and determines the current communication quality. If the communication quality is good, the controller 90 generates the control signals S1 and S2, determining that the resolution of the analog-to-digital converter 10 can be lowered. On the other hand, if the communication quality is poor, the controller 90 generates the control signals S1 and S2 so as to increase the resolution of the analog-to-digital converter 10. In this way, the controller 90 may control the resolution of the analog-to-digital converter 10 in accordance with the quality of the communication signal.

Figure 8:
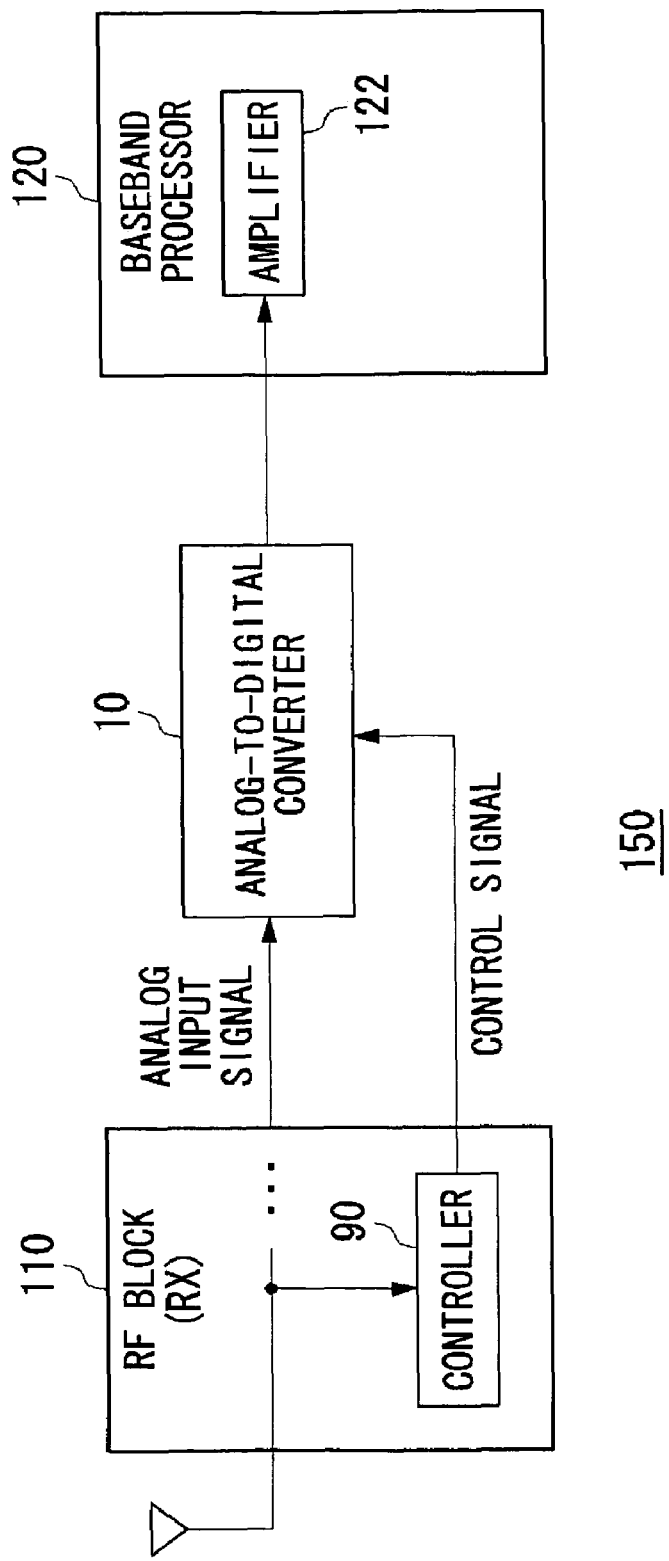
FIG. 8 is a diagram showing another example of configuration on the receiving side of the radio communication apparatus in which the analog-to-digital converter is incorporated.

FIG. 8 shows another example of configuration on the receiver side of the radio communication apparatus in which the analog-to-digital converter according to the first embodiment is incorporated. The radio communication apparatus 150 comprises a receiving RF block 110, the analog-to-digital converter 10, and a baseband processor 120. The RF block 110 receives a radio communication signal from the antenna, and supplies an analog input signal to the analog-to-digital converter 10. The RF block 110 has a controller 90 which measures RSSI (Received Signal Strength Indicator). For example, when RSSI is high, the controller 90 generates the control signals S1 and S2, determining that the resolution of the analog-to-digital converter 10 can be lowered. On the other hand, if RSSI is low, the controller 90 generates the control signals S1 and S2 so as to increase the resolution of the analog-to-digital converter 10. In this way, the controller 90 may control the resolution of the analog-to-digital converter 10 in accordance with the reception strength of the communication signal.

Up to this point, the present invention has been described with reference to the first embodiment. This first embodiment has been given solely by way of illustration. It will thus be understood by those skilled in the art that various modifications may be made to combinations of the foregoing components and processes, and all such modifications are also intended to fall within the scope of the present invention. The first embodiment has dealt with a parallel analog-to-digital converter having a maximum resolution of three bits. It is understood, however, that the present invention may be applied to an analog-to-digital converter having a maximum resolution higher than three bits.

Figure 9:
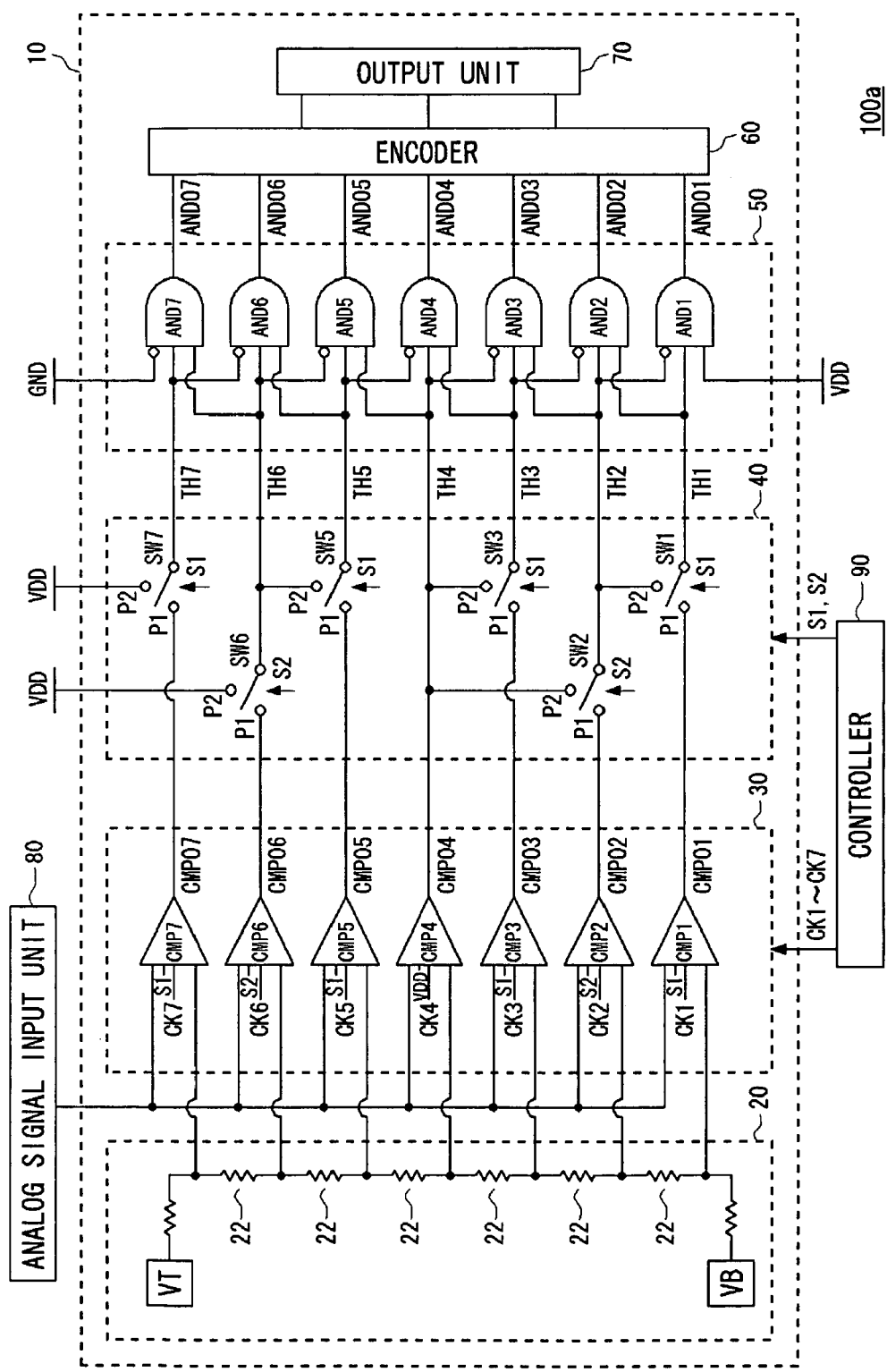
FIG. 9 is a diagram showing a modification of configuration of the analog-to-digital conversion apparatus according to the first embodiment.

FIG. 9 is a diagram showing a modification of configuration of the analog-to-digital conversion apparatus according to the first embodiment. In the analog-to-digital conversion apparatus 100 shown in FIG. 2, the comparators have been disabled by stopping the clocks input thereto. In contrast, in the analog-to-digital conversion apparatus 100a shown in FIG. 9, preamplifier circuits that constitute the comparators are also disabled by stopping constant currents supplied thereto. As shown in FIG. 9, each of CMPs other than CMP4 receives not only CK but the control signal S1 or S2 as well. The control signals S input to the comparators are the same as those supplied to SWs that are provided for the respective comparators. CMP 4 does not receive the control signal S1 or S2, but receives VDD to make it enable at all times.

Figure 10A:
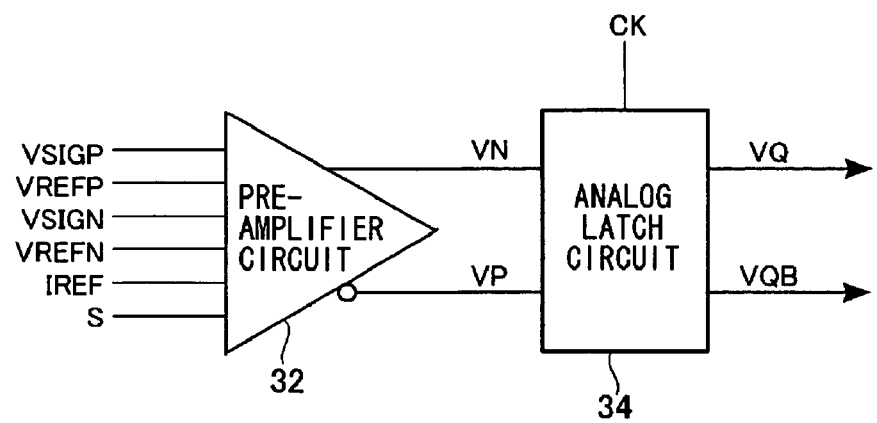
FIG. 10A is a diagram showing the configuration of a comparator.
Figure 10B:
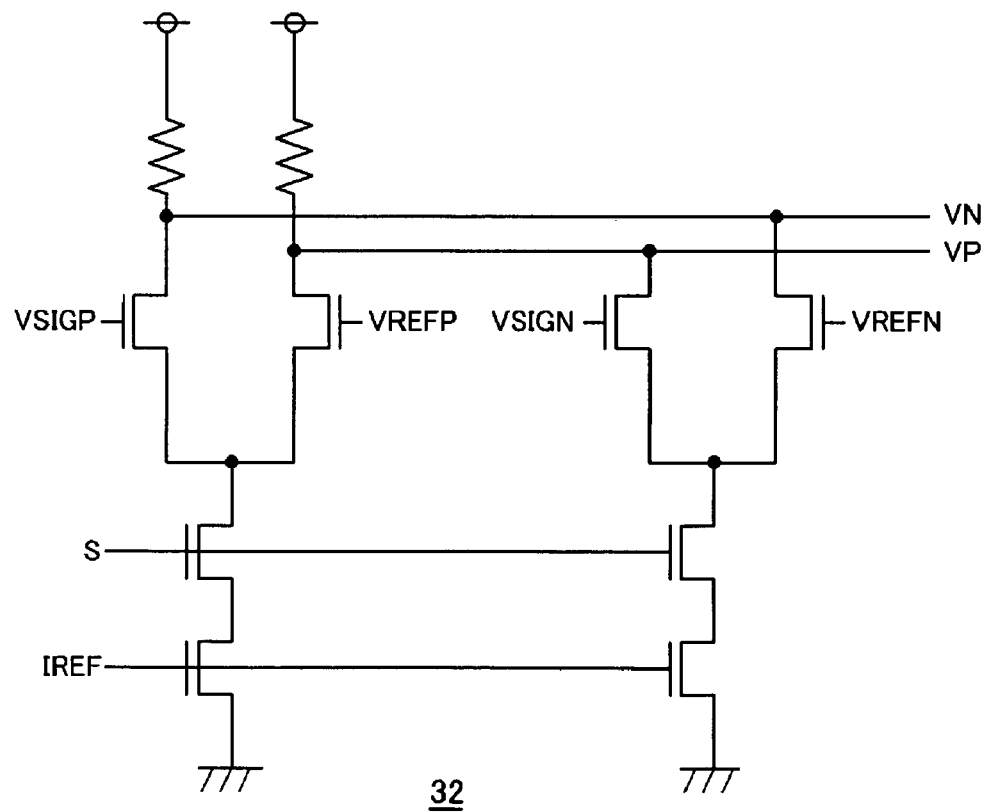
FIG. 10B is a diagram showing the circuit configuration of a preamplifier circuit.

FIG. 10A shows the configuration of the comparators. Each comparator is composed of a preamplifier circuit 32 and an analog latch circuit 34. The preamplifier circuit 32 shown in FIG. 10A is a differential amplifier, whereas a single-ended amplifier may be used. FIG. 10B shows the circuit configuration of the preamplifier circuit 32, a differential amplifier.

The preamplifier circuit 32 receives the following signals: differential inputs VSIGP and VSIGN of the analog signal supplied from the analog signal input unit 80; differential inputs VREFP and VERFN of the reference signal supplied from the reference signal generation circuit 20; a constant current IREF supplied from a constant current source; and the control signal S (S1 or S2). In the case of a differential amplifier like this, the preamplifier circuit 32 compares (VSIGP-VSIGN) and (VREFP-VREFN).

As shown in FIG. 10B, when the gates of the transistors supplied with the control signal S are closed, the supply of the constant current IREF is stopped. When the control signal S1 or S2 has a logical value "0," the operation of the comparator is stopped by CK. In the analog-to-digital conversion apparatus 100a, the supply of the constant current IREF from the preamplifier circuit 32 is also stopped. This can reduce the power consumption of the analog-to-digital conversion apparatus 100a. Here, the control signals S used in the interpolation circuit 40 can be simply utilized for the effective power saving.

Figure 11:
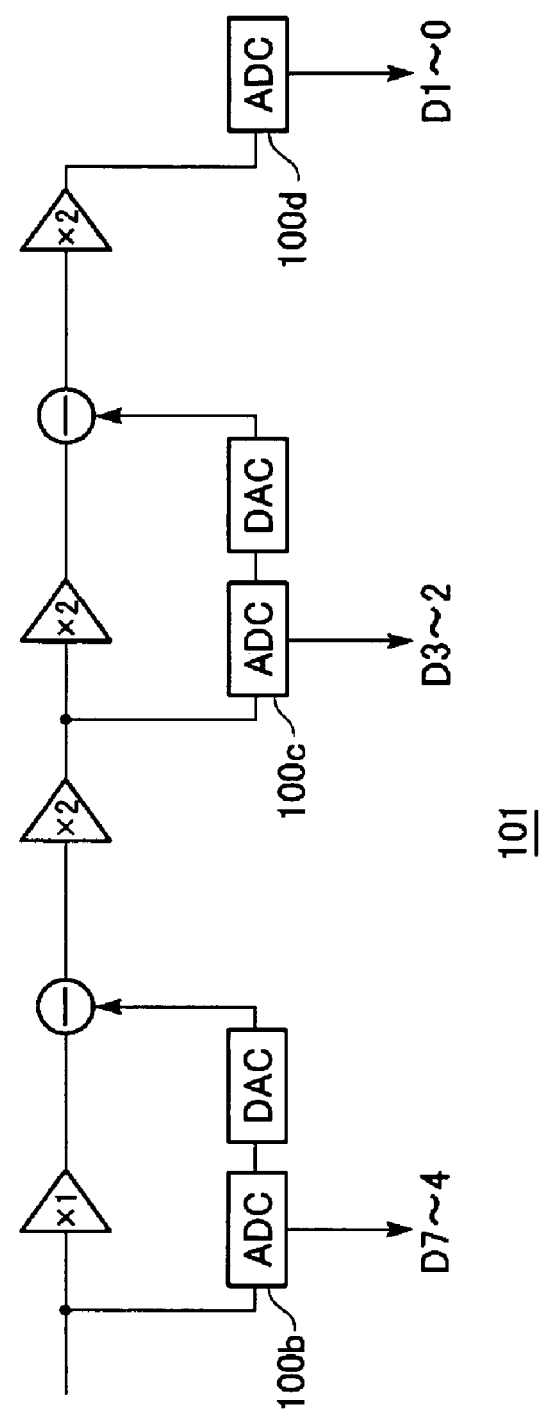
FIG. 11 is a diagram showing the configuration of a parallel pipeline analog-to-digital conversion apparatus.

FIG. 11 shows the configuration of a parallel pipeline analog-to-digital conversion apparatus 101. The analog-to-digital conversion apparatus 101 comprises a plurality of analog-to-digital conversion apparatuses 100b, 100c, and 100d of parallel type. While the analog-to-digital conversion apparatuses 100 may be used alone, they can also be used as sub ADCs in the pipeline analog-to-digital conversion apparatus 101 or the like.

SECOND EMBODIMENT

With the digitalization and acceleration of signal processing in information communication devices and with the weight saving and miniaturization of the devices, higher speed and higher performance are also required of analog-to-digital conversion apparatuses to be mounted thereon. For wireless devices and the like which are currently improving in bit rate, analog-to-digital conversion apparatuses capable of high-speed sampling operations have been proposed (for example, see Japanese Patent Laid-Open Publication No. 2003-101411).

This analog-to-digital conversion apparatus comprises: a reference voltage generation circuit for outputting a plurality of reference voltages; a plurality of comparators each for comparing one of the reference voltages with an analog input signal; and an encoder for outputting a digital signal based on results from the comparators.

Since the analog-to-digital conversion apparatus described in Japanese Patent Laid-Open Publication No. 2003-101411 requires a large number of comparators and supplies clocks to the respective comparators, the internal clock tree becomes large in scale. Operating such an analog-to-digital conversion apparatus at high speed requires that these clocks have skews as closely matched as possible. In the phase of actual operation, however, the clock skews do not match as designed due to manufacturing fluctuations as well as variations in the operating environment including temperature changes and supply voltage drops. There has thus been the problem that if the clock skews inside the analog-to-digital conversion apparatus are not uniform, insufficient propagation time of data inside the analog-to-digital conversion apparatus can deteriorate the S/N ratio of the output signal.

The second embodiment of the present invention has been achieved in view of the foregoing. It is thus an object thereof to provide an analog-to-digital conversion apparatus capable of high-speed sampling operation at a favorable S/N ratio.

One of the aspects of the second embodiment relates to an analog-to-digital conversion apparatus. This analog-to-digital conversion apparatus is one for converting an analog signal into a digital signal through at least two functional blocks, being configured so that the functional blocks make a pipeline operation. The apparatus comprises a clock control unit which adjusts skews of clocks to be supplied to the respective functional blocks based on an S/N ratio of the digital signal converted by the analog-to-digital conversion apparatus.

According to this aspect, the clocks inside the analog-to-digital conversion apparatus are adjusted in skew based on the S/N ratio of the digital signal given analog-to-digital conversion. Consequently, even when the analog-to-digital conversion apparatus is operated to make sampling operations at high speed and fails to propagate signals accurately inside, causing a drop in the S/N ratio of the digital signal given analog-to-digital conversion, it is possible to adjust the skews of the respective clocks so as to increase the S/N ratio of the digital signal. The digital signal given analog-to-digital conversion can thus be increased in S/N ratio. As a result, it is possible to realize an analog-to-digital conversion apparatus which can make high-speed sampling operations at a favorable S/N ratio.

In this aspect, the clock control unit may adjust the skews by changing the delay times of clock signals of the clocks to be supplied to the respective functional blocks individually. Since the delay times of the clock signals supplied to the respective pipeline stages are changed independently, it is possible to adjust the clock skews finely.

Moreover, in this aspect, the skews may be adjusted repeatedly while the S/N ratio is lower than or equal to a predetermined level. As a result, the skews of the clocks inside the analog-to-digital conversion apparatus can be adjusted until the digital signal given analog-to-digital conversion reaches a predetermined level. The analog-to-digital conversion apparatus can thus make high-speed sampling operations at a favorable S/N ratio.

Incidentally, any combinations of the foregoing components, and the components and expressions of the present invention mutually replaced with methods, apparatuses, systems, and the like are also intended to constitute applicable aspects of the present invention.

The second embodiment of the present invention is an analog-to-digital conversion apparatus to be used in a receiver of a communication system in which frequency hopping is performed symbol by symbol. The symbols intended for frequency hopping are of OFDM (Orthogonal Frequency Division Multiplexing) modulation scheme, and this communication system is targeted for UWB (Ultra Wide Band) based on MB-OFDM (Multiband OFDM) modulation scheme.

Figure 12:
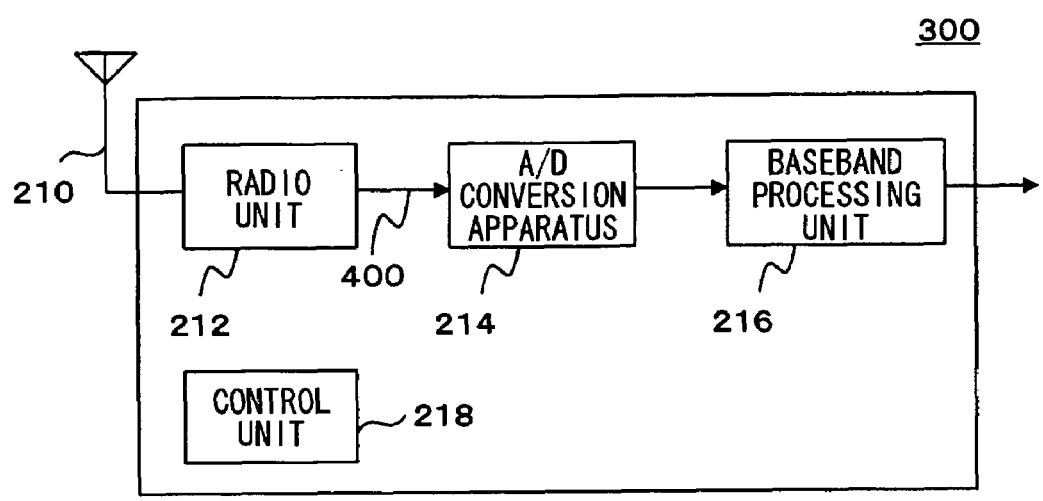
FIG. 12 is a block diagram of a receiver according to a second embodiment of the present invention.

FIG. 12 shows the configuration of a receiver 300 according to the second embodiment of the present invention. The receiver 300 includes an antenna 210, a radio unit 212, an analog-to-digital conversion apparatus 214, a baseband processing unit 216, and a control unit 218.

The antenna 210 receives a signal from a not-shown transmitter via a radio interval. The signal to be received is modulated by OFDM scheme and FH (Frequency Hopping) scheme. Each of the sub-carriers is phase-modulated by QPSK (Quadrature Phase Shift Keying). The OFDM symbols, a unit of OFDM modulation scheme, are frequency hopped according to a predetermined hopping pattern. The OFDM symbols will be described later. Incidentally, the signal to be received has a predetermined radio frequency.

The radio unit 212 frequency-converts the radio-frequency signal received by the antenna 210 into a baseband signal. The radio unit 212 has a code generator for the sake of performing frequency hopping according to the predetermined hopping pattern. The code generator generates a pseudorandom code signal which is in synchronization with the hopping pattern of the radio-frequency signal received. The code generator establishes synchronization with the hopping pattern of the received radio-frequency signal by using a predetermined method. Incidentally, the baseband signal contains both an in-phase component and an orthogonal component, and thus should typically be represented by two signal lines. Nevertheless, for the sake of clear description, the baseband signal will hereinafter be represented by a single signal line.

The analog-to-digital conversion apparatus 214 converts the analog signal, or baseband signal, input from the radio unit 212 into a digital signal. This analog-to-digital conversion apparatus 214 has a configuration that is characteristic to the present invention. That is, the analog-to-digital conversion apparatus 214 evaluates the S/N ratio by using the digital signal converted, and adjusts the skews of the clock tree inside the analog-to-digital conversion apparatus 214 until a predetermined S/N ratio is obtained. The configuration and operation of this analog-to-digital conversion apparatus 214 will be described later.

The baseband processing unit 216 demodulates the baseband signal, or signal that is digitally converted by the analog-to-digital conversion apparatus 214. The control unit 218 exercises control on the entire receiver 300 so that the receiver 300 can perform predetermined processing.

Figure 13A:
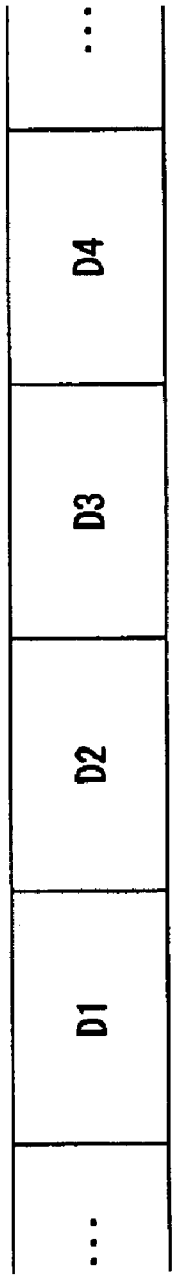
FIGS. 13A and 13B are diagrams showing the configuration of symbols in signals to be received by the receiver of FIG. 12.
Figure 13B:
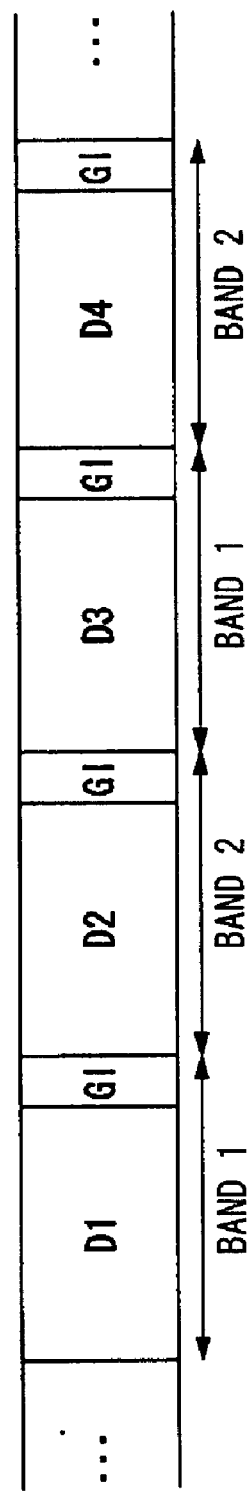

FIGS. 13A and 13B show the configuration of symbols of the signal to be received by the receiver 300. FIG. 13A shows a signal that is given IFFT (Inverse Fast Fourier Transform) in the transmitter (hereinafter, referred to as "IFFT signal") In the transmitter, signals in the frequency domain are given IFFT and converted into signals in the time domain. Here, both IFFT in the transmitter and FFT (Fast Fourier Transform) in the receiver are executed in units of 128 pieces of data, i.e., an FFT window (hereinafter, timing corresponding to one of 128 pieces of data will be referred to as "FFT point"). FIG. 13A shows 128 FFT points of data as "D1," "D2," "D3," "D4," . . . from the top.

FIG. 13B shows a signal that is obtained by adding guard intervals (GIs) to the IFFT signal shown in FIG. 13A. As shown in the diagram, "GI" is added to behind each of "D1," "D2," "D3," and "D4" which show the 128-FFT-point data. Here, "GI" shall correspond to a portion where no signal is transmitted, i.e., non-transmission interval. Moreover, combinations of 128 FFT points of data and "GIs" will be referred to as "OFDM symbols" mentioned above. For example, "D1" and "GI" correspond to a single OFDM symbol. The same holds for "D2," "D3," and "D4."

Figure 14A:
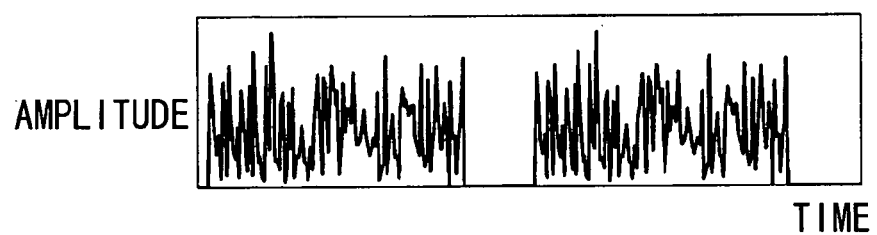
FIGS. 14A and 14B are diagrams showing the waveforms of signals to be received by the receiver of FIG. 12.
Figure 14B:
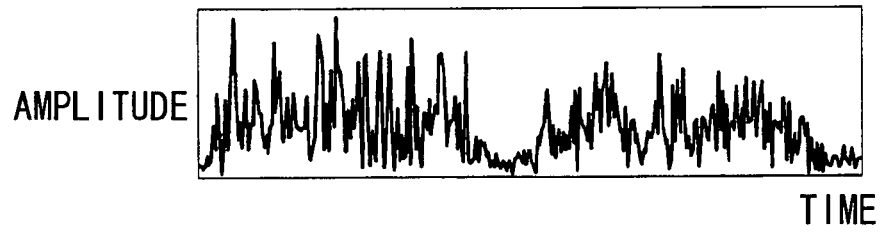

FIGS. 14A and 14B show the waveforms of signals to be received by the receiver 300. FIG. 14A shows the waveform of a signal corresponding to FIG. 13B. As shown in the chart, OFDM symbols are formed by repeating a transmission interval corresponding to the IFFT signal and a non-transmission interval corresponding to GI. FIG. 14B shows the waveform of the signal of FIG. 13A that is received by the antenna 210 via a radio transmission line. Since delayed waves occur in the radio transmission line, the antenna 210 receives some signals even in GI intervals. The signal strength is smaller in GI intervals than in IFFT signal intervals. In the second embodiment of the present invention, the S/N ratio is derived from these IFFT signal intervals and GI intervals.

Figure 15:
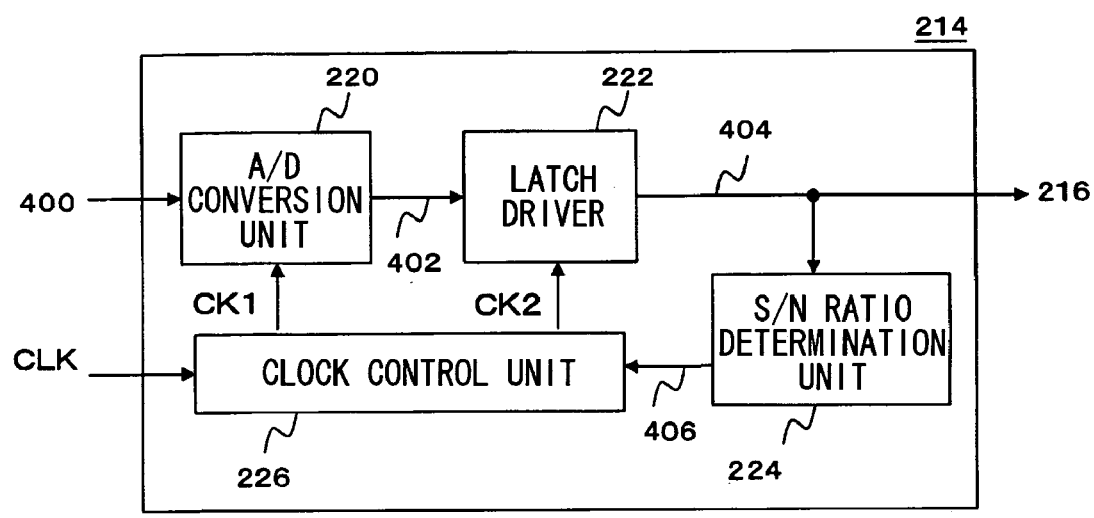
FIG. 15 is a block diagram of an analog-to-digital conversion apparatus according to the second embodiment of the present invention.

FIG. 15 is a block diagram showing the configuration of the analog-to-digital conversion apparatus 214. The analog-to-digital conversion apparatus 214 is an analog-to-digital conversion apparatus of parallel type, and includes an analog-to-digital conversion unit 220, a latch driver 222, an S/N ratio determination unit 224, and a clock control unit 226. This analog-to-digital conversion apparatus 214 has the analog-to-digital conversion unit 220 and the latch driver 222 as respective functional blocks, and is configured so that these two functional blocks make a pipeline operation.

The analog-to-digital conversion unit 220 converts an analog signal 400 (the baseband signal output from the radio unit 212) into n bits of digital signal 402. This analog-to-digital conversion unit 220 has a reference voltage generation circuit, $2^n$ comparators, and an encoder. The reference voltage generation circuit outputs $2^n$ reference voltages. The comparators compare the analog signal 400 with the respective reference voltages generated by the reference voltage generation circuit. The encoder encodes the outputs of the comparators into the n bits of digital signal 402 for output. The analog-to-digital conversion unit 220 operates in synchronization with a clock CK1 whose clock skew is adjusted by the clock control unit 226.

The latch driver 222 latches the n-bit digital signal 402 output from the analog-to-digital conversion unit 220, and outputs the latched digital signal 404 to the baseband processing unit 216 in the subsequent stage. The digital signal 404 output from the latch driver 222 is also input to the S/N ratio determination unit 224. This latch driver 222 operates in synchronization with a clock CK2 whose clock skew is adjusted by the clock control unit 226.

The S/N ratio determination unit 224 determines the S/N ratio of the digital signal 404 output from the latch driver 222. As mentioned previously, the digital signal 404 has both transmission intervals corresponding to the IFFT signal and non-transmission intervals corresponding to GIs. To make a determination on the S/N ratio, the S/N ratio of the digital signal 404 is calculated from the IFFT signal and the signal of an interval corresponding to GI. Then, whether or not the calculated S/N ratio exceeds a predetermined S/N ratio is determined. If the calculated S/N ratio is lower than or equal to the predetermined S/N ratio, the S/N ratio determination unit 224 outputs a pulse 406 to the clock control unit 226. The value of the predetermined S/N ratio may be stored in the S/N ratio determination unit 224 in advance. Alternatively, the value may also be set by the control unit 218.

Now, description will be given of the method for calculating the S/N ratio of the digital signal 404. Initially, electric power is integrated over the IFFT signal interval of a single OFDM symbol. Here, the power across the interval of the input IFFT signal is integrated at sampling intervals with which the baseband processing unit 216 operates. Electric power is also integrated over the GI interval of the single OFDM symbol. Here, the power across the interval of the input GI is integrated at sampling intervals with which the baseband processing unit 216 operates. Incidentally, the interval of the IFFT signal and the interval of GI in an OFDM symbol are separated based on information as to the border between the interval of the IFFT signal and that of GI, which input from the baseband processing unit 216.

Next, the power integrated over the interval of the IFFT signal is averaged in accordance with the number of samples in the interval of the IFFT signal. The same processing is also performed on the GI interval. That is, since the interval of the IFFT signal and that of GI are different in length, it is difficult to process the power integrated over the interval of the IFFT signal and the power integrated over the interval of GI directly. Averaging is thus performed so as to make the powers processible.

Then, the S/N ratio is calculated by dividing the average power in the interval of the IFFT signal by the average power in the interval of GI. To be exact, the average power in the GI interval is different from a perfect noise level since delayed waves are also received in the GI interval. Nevertheless, this power is typically lower than the average power in the interval of the IFFT signal, and thus can be considered as a noise level. Incidentally, the average power of the GI interval may be obtained from a last part of the GI interval. This can reduce the influence of delayed waves.

When the pulse 406 is supplied from the S/N ratio determination unit 224, the clock control unit 226 adjusts the clock skews of the clocks CK1 and CK2 to be input to the analog-to-digital conversion unit 220 and the latch driver 222. The clock skews are adjusted by changing the delay times of the clocks CK1 and CK2.

Figure 16:
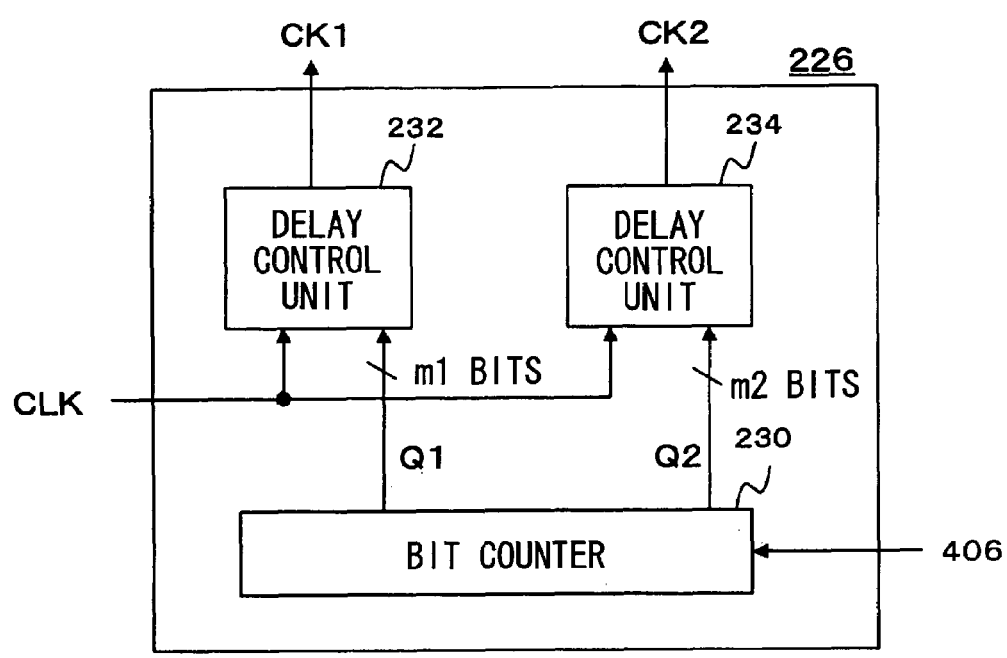
FIG. 16 is a block diagram of a clock control unit of FIG. 15.

FIG. 16 is a diagram showing the configuration of the clock control unit 226. This clock control unit 226 includes a bit counter 230, and two delay control units 232 and 234.

The bit counter 230 is an (m1+m2)-bit counter, and counts the number of pulses 406 input from the S/N ratio determination unit 224. More specifically, each time a pulse 406 is input, the bit counter 230 is incremented by one. The bit counter 230 outputs upper m1 bits of signal Q1 to the delay control unit 232, and lower m2 bits of signal Q2 to the delay control unit 234.

The delay control unit 232 delays the input clock CLK to generate the clock CK1 of the analog-to-digital conversion unit 220. The delay control unit 234 delays the input clock CLK to generate the clock CK2 of the latch driver 222. The amounts of delay are individually determined in accordance with the value of the bit counter 230. More specifically, the amount of delay of the delay control unit 232 is determined based on the value of the upper m1 bits of signal Q1 from the bit counter 230. The amount of delay of the delay control unit 234 is determined based on the value of the lower m2 bits of signal Q2 from the bit counter 230. Then, the bit counter 230 counts up to vary the values of the signals Q1 and Q2, whereby the amounts of delay of the delay control units 232 and 234 are changed. The delay control units 232 and 234 thus delay the input clock CLK separately based on the value of the bit counter 230, thereby adjusting the clock skews of the clock CK1 of the analog-to-digital conversion unit 220 and the clock CK2 of the latch driver 222.

Figure 17:
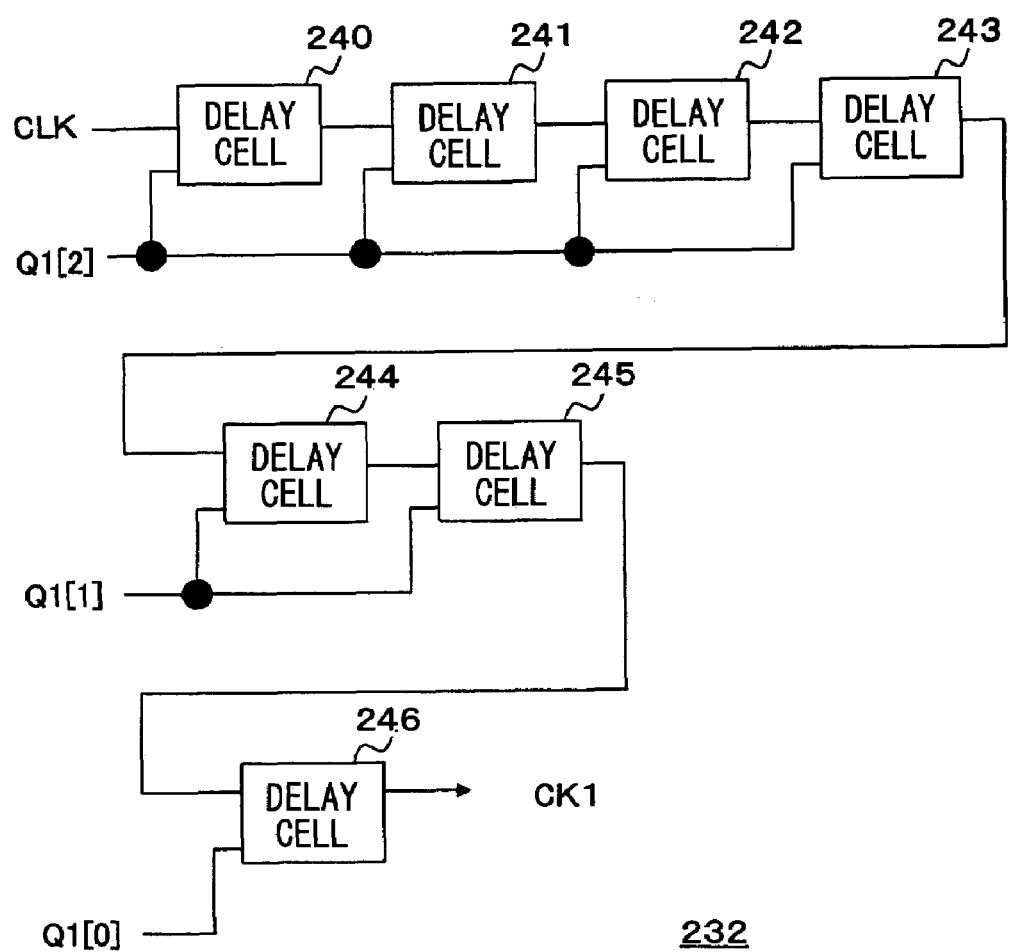
FIG. 17 is a block diagram of a delay control unit of FIG. 16.

FIG. 17 is a diagram showing the configuration of the delay control unit 232 where three bits of signal Q1 are input from the bit counter 230. This delay control unit 232 has seven delay cells 240 to 246 in cascade connection. The input clock CLK is input to the delay cell 240 in the initial stage. The output of the delay cell 246 in the final stage is output as the clock CK1 of the analog-to-digital conversion unit 220.

Figure 18A:
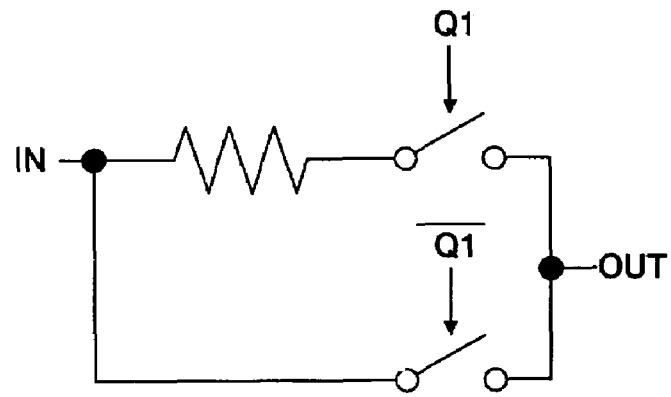
FIGS. 18A to 18C are diagrams showing examples of configuration of the delay cells in FIG. 17.
Figure 18B:
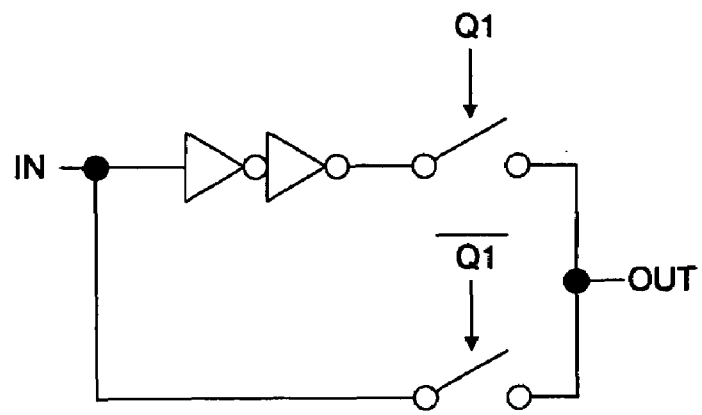
Figure 18C:
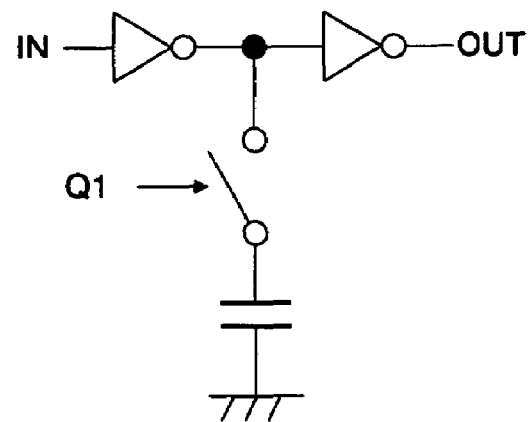

FIGS. 18A to 18C show examples of configuration of each delay cell 240 to 246. FIG. 18A shows an example where the delay cell is made of a resistor. When the signal Q1 is "1," the switch connected to the resistor turns on and the switch not connected to the resistor turns off, whereby an input signal IN is delayed and output as an output signal OUT. When the signal Q1 is "0," the switch not connected to the resistor turns on and the switch connected to the resistor turns off, whereby the input signal IN is output as the output signal OUT without delay. The delay cell shown in FIG. 18B is an example where the resistor shown in FIG. 18A is replaced with two inverters. The operation is the same as in FIG. 18A.

FIG. 18C shows an example where the delay cell is composed of two inverters and a capacitor. When the signal Q1 is "0," the input signal IN is delayed by the two inverters and output as the output signal OUT. On the other hand, when the signal Q1 is "1," the capacitor is interposed between the midpoint of the two inverters and a ground point. As a result, the input signal IN is delayed largely by the capacitor and output as the output signal OUT.

Incidentally, in the delay cells of FIGS. 18A to 18C, the signal Q1 may be inverted in polarity. In such cases, the input signal IN is delayed largely and output as the output signal OUT when the signal Q1 is "0."

The delay control unit 232 of FIG. 17 is provided with the delay cells 240 to 246 which have the configuration of any one of FIGS. 18A to 18C. Among the three bits of the signal Q1, the least significant bit Q1[0] is connected to a single delay cell 246. The middle bit Q1[1] is connected to two delay cells 244 and 245. The most significant bit Q1[2] is connected to four delay cells 240 to 243. When the signal Q1[0] is "1," the delay cell 246 delays the input clock CLK as much as a single stage of delay cell. When the signal Q1[1] is "1," the delay cells 244 and 245 delay the input clock CLK as much as two stages of delay cells. When the signal Q1[2] is "1," the delay cells 240 to 243 delay the input clock CLK as much as four stages of delay cells. In consequence, when the three bits of signal Q1 is changed from "0" to "7," the input clock CLK is output as the clock CK1 to the analog-to-digital conversion unit 220 without delay or with a delay as much as one to seven stages of delay cells.

FIG. 17 has shown an example of the delay control unit 232 where the signal Q1 consists of three bits. If the signal Q1 consists of m1 bits, $(2^{m1}-1)$ delay cells shall be cascaded to constitute the delay control unit 232. Here, $2^k$ delay cells are connected for the kth bit Q1[k] ($0 \leq k < m1-1$). Consequently, the m1 bits of signal Q1 can be changed to output the input clock CLK as the clock CK1 to the analog-to-digital conversion unit 220 without delay or with a delay as much as one to $2^{m1}$ stages of delay cells.

The delay control unit 234 can also be achieved by the same configuration as in FIG. 17. More specifically, when the signal Q2 consists of m2 bits, $(2^{m2}-1)$ delay cells are cascaded to constitute the delay control unit 234. Here, $2^l$ delay cells are connected for the lth bit Q2[1] ($0 \leq l < m2-1$). Consequently, the m2 bits of signal Q2 can be changed to output the input clock CLK as the clock CK2 to the latch driver 222 without delay or with a delay as much as one to $2^{m2-1}$ stages of delay cells.

Now, the operation of the receiver 300 having the foregoing configuration will be described. The radio unit 212 converts the frequency of the signal that is frequency hopped in units of OFDM symbols, from radio frequencies into baseband frequencies, and outputs the resultant as a received signal 400. The analog-to-digital conversion apparatus 214 converts the received signal 400, an analog signal, into a digital signal. Here, the bit counter 230 of the clock control unit 226 inside the analog-to-digital conversion apparatus 214 is set at an arbitrary value. Based on the value of the bit counter 230, the amount of delay of the clock CK1 for driving the analog-to-digital conversion unit 220 and the amount of delay of the clock CK2 for driving the latch driver 222 are determined with respect to the input clock CLK.

The digital signal 404 converted by the analog-to-digital conversion apparatus 214 is input to the baseband processing unit 216, whereby a baseband signal is demodulated. The digital signal 404 is also input to the S/N ratio determination unit 224 inside the analog-to-digital conversion apparatus 214. The S/N ratio determination unit 224 calculates the S/N ratio of the digital signal 404, and determines whether or not the calculated S/N ratio is higher than a predetermined S/N ratio. If the S/N ratio determination unit 224 determines that the calculated S/N ratio is higher than the predetermined S/N ratio, it will not change the value of the bit counter 230 in the clock control unit 226. The amount of delay of the clock CK1 and the amount of delay of the clock CK2 are kept unchanged with respect to the input clock CLK.

On the other hand, if the S/N ratio determination unit 224 determines that the calculated S/N ratio is lower than or equal to the predetermined S/N ratio, the S/N ratio determination unit 224 generates a pulse and inputs this pulse to the clock control unit 226. When receiving the pulse from the S/N ratio determination unit 224, the clock control unit 226 increments the value of the bit counter 230 by one. Based on the incremented value of the bit counter 230, the amounts of delay of the clocks CK1 and CK2 with respect to the input clock CLK are determined anew, whereby the respective clock skews are adjusted. Using CK1 and CK2 having the new clock skews, the analog-to-digital conversion apparatus 214 converts the received signal 400 into the digital signal 404 again. The S/N ratio determination unit 224 makes a determination on the S/N ratio by using this new digital signal 404. If the S/N ratio of the digital signal 404 is lower than or equal to the predetermined S/N ratio, the S/N ratio determination unit 224 outputs a pulse to the clock control unit 226, thereby adjusting the clock skews of the clocks CK1 and CK2 again. The adjustment to the clock skews of the clocks CK1 and CK2 is repeated subsequently until the S/N ratio of the digital signal 404 exceeds the predetermined S/N ratio.

Figure 19:
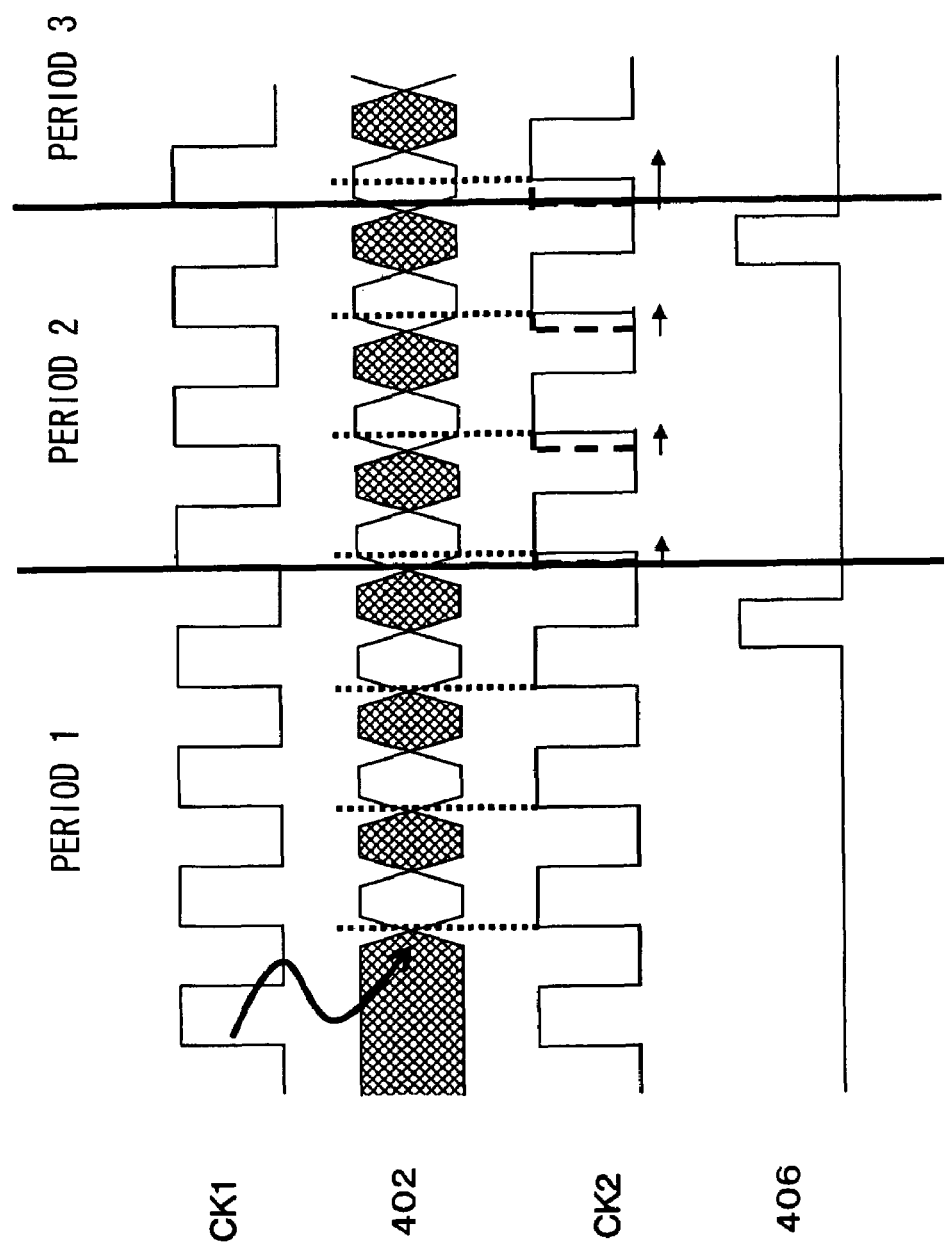
FIG. 19 is a timing chart showing signals inside the analog-to-digital conversion apparatus shown in FIG. 15.

FIG. 19 shows an example of a timing chart showing the clock CK1 input to the analog-to-digital conversion unit 220 inside the analog-to-digital conversion apparatus 214, the output signal 402 of the same, the clock CK2 input to the latch driver 222, and the output pulses 406 of the S/N ratio determination unit 224. Incidentally, the timing of the output signal 402 shown shaded in FIG. 19 indicates that the output signal 402 has an unsettled value, while the timing shown hollowed indicates that the output signal 402 has a settled value.

In FIG. 19, the output signal 402 of the analog-to-digital conversion unit 220 is output in synchronization with the clock CK1 at such timing as shown in the chart. In period 1, the clock CK1 and the clock CK2 have the same clock skews. In such situations, the rise of the clock CK2 overlaps with the timing at which the output signal 402 of the analog-to-digital conversion unit 220 changes. The latch driver 222 operating in synchronization with the clock CK2 thus cannot latch the output signal 202 of the analog-to-digital conversion unit 220 properly. Consequently, the digital signal 404, or the output signal of the latch driver 222, shows a poor S/N ratio, and the S/N ratio determination unit 224 outputs a pulse 406 to the clock control unit 226. Receiving the output pulse 406, the clock control unit 226 increases the amount of delay of the clock CK2.

Next, in period 2, the amount of delay of the clock CK2 is increased to widen the clock skew between the clock CK1 and the clock CK2 slightly. In this state, the output signal 402 of the analog-to-digital conversion unit 220 is still unsettled at the point in time when the clock CK2 rises. The latch driver 222 operating in synchronization with the clock CK2 thus cannot latch the output signal 402 of the analog-to-digital conversion unit 220 properly. The digital signal 404, the output signal of the latch driver 222, thus shows a poor S/N ratio even in period 2. The S/N ratio determination unit 224 outputs a pulse 406 to the clock control unit 226. Receiving the output pulse 406, the clock control unit 226 increases the amount of delay of the clock CK2 further.

Next, in period 3, the clock skew between the clocks CK1 and CK2 is increased further. In this state, the output signal 402 of the analog-to-digital conversion unit 220 is settled by the point in time when the clock CK2 rises. The latch driver 222 operating in synchronization with the clock CK2 can thus latch the output signal 402 of the analog-to-digital conversion unit 220 properly. Consequently, the digital signal 404, the output signal of the latch driver 222, shows an improved S/N ratio. The S/N ratio determination unit 224 outputs no pulse 406 to the clock control unit 226, and the clock skew adjustment is ended. Subsequently, the clock control unit 226 maintains the amounts of delay of the respective clocks constant unless the S/N ratio of the digital signal 404 falls to or below the predetermined value. Conversely, when the clock skews of the clocks CK1 and CK2 vary due to temperature changes or the like, and when the internal delays vary, the S/N ratio of the digital signal 404 may fall to or below the predetermined value again. In such cases, the S/N ratio determination unit 224 outputs pulses 406 to the clock control unit 226, thereby adjusting the clock skews of the clocks CK1 and CK2 again.

As has been described, according to the second embodiment of the present invention, an S/N ratio is calculated from the digital signal given analog-to-digital conversion. If the calculated S/N ratio is lower than or equal to a predetermined S/N ratio, the delay times of the clock signals of the clocks to be supplied to the respective pipeline stages inside the analog-to-digital conversion apparatus are changed to adjust the clock skews. Consequently, even in high-speed sampling operations, the skews of the clocks can be adjusted to allow accurate signal propagation inside the analog-to-digital conversion apparatus, thereby improving the S/N ratio of the digital signal given analog-to-digital conversion. The analog-to-digital conversion apparatus can thus make high-speed sampling operations at a favorable S/N ratio.

Moreover, since it is possible to adjust the skews of the respective clocks while making operations actually, wide margins need not be provided for clock skews in the design phase so as to correspond to the manufacturing processes and operating environment. The analog-to-digital conversion apparatus capable of high-speed sampling operations can thus be designed even easily. In addition, since the clock skews can be adjusted according to changes in actual operating environment such as temperature, it is possible to realize an analog-to-digital conversion apparatus which makes compensation on high-speed sampling operations in a wide range of operation environment.

Up to this point, the present invention has been described with reference to the second embodiment. The second embodiment has been given solely by way of illustration. It will thus be understood by those skilled in the art that various modifications may be made to combinations of the foregoing components and processes, and all such modifications are also intended to fall within the scope of the present invention.

For example, FIG. 15 has dealt with the case where the S/N ratio determination unit 224 outputs a pulse to the clock control unit 226 when the S/N ratio determination unit 224 determines that the S/N ratio of the digital signal 404 is lower than or equal to a predetermined value. Instead, the S/N ratio determination unit 224 may output an enable signal that is activated when the S/N ratio of the digital signal 404 falls to or below the predetermined value, and deactivated when the S/N ratio of the digital signal 404 exceeds the predetermined value. In this case, the clock control unit 226 may be provided with a pulse signal generation circuit which generates a pulse signal by each single cycle while the enable signal is activated. Then, the pulse signal generated by this pulse signal generation circuit may be input to the bit counter 230. Incidentally, this single cycle has only to last until the analog-to-digital conversion unit 220 performs an analog-to-digital conversion, the latch driver 222 latches and outputs the digital signal, and the S/N ratio determination unit 224 makes a determination on the S/N ratio of the digital signal 404.

FIG. 15 has also dealt with the case where the analog-to-digital conversion apparatus 214 has the analog-to-digital conversion unit 220 and the latch driver 222 as respective functional blocks, and is configured so that these two functional blocks make a pipeline operation. The analog-to-digital conversion apparatus 214 is not limited to this configuration, but may include more than two pipeline stages. For example, the analog-to-digital conversion unit 220 may be divided into two functional blocks, or comparators and an encoder, so that a total of three pipeline stages are formed including the latch driver 222. Moreover, a circuit for correcting bubble errors, which can occur frequently when a plurality of comparators make high-speed operations, may be added to the subsequent stage of the comparators so that it makes one of the functional blocks to constitute the pipeline. Incidentally, when the analog-to-digital conversion apparatus 214 is composed of a plurality of pipeline stages, the clock control unit 226 shall adjust the amounts of delay of the clocks to be input to the respective pipeline stages.

The second embodiment has dealt with the configuration that the S/N ratio determination unit is arranged inside the analog-to-digital conversion apparatus 214. Depending on the communication system, however, determinations on the S/N ratio may be made by the baseband processing unit 216. In such cases, the analog-to-digital conversion apparatus 214 need not include the S/N ratio determination unit 224. Instead, determinations made by an S/N ratio determination unit arranged in the baseband processing unit 216 may be fed back to the analog-to-digital conversion apparatus 214.

What is claimed is:

1. An analog-to-digital converter comprising a plurality of comparators connected in parallel, each for comparing potentials of an analog input signal and a reference signal, wherein the number of comparators to operate is changed by an external control signal, thereby varying resolution, and when the converter is operated at a resolution lower than the maximum resolution, adjoining comparators are not operated simultaneously.

2. An analog-to-digital conversion apparatus comprising:

an analog-to-digital converter having a plurality of comparators connected in parallel, each for comparing potentials of an analog input signal and a reference signal; and a controller which generates a control signal for controlling resolution of the analog-to-digital converter, wherein when the analog-to-digital converter is operated at a resolution lower than the maximum resolution, the controller does not operate adjoining comparators simultaneously.

3. The analog-to-digital conversion apparatus according to claim 2, wherein the controller controls the number of the comparators to operate by means of the control signal so as to determine the resolution.

4. The analog-to-digital conversion apparatus according to claim 2, wherein the comparator is disabled by stopping clock input thereto.

5. The analog-to-digital conversion apparatus according to claim 2, wherein:

the comparator is composed of a preamplifier circuit and an analog latch circuit; and the preamplifier circuit is disabled by stopping a supply of a constant current.

6. An analog-to-digital conversion apparatus comprising:

an analog-to-digital converter having a plurality of comparators connected in parallel, each for comparing potentials of an analog input signal and a reference signal; and a controller which generates a control signal for controlling resolution of the analog-to-digital converter; and an interpolation circuit which interpolates the output data of the comparators that are disabled depending on the resolution.

7. The analog-to-digital conversion apparatus according to claim 6, wherein even when the resolution is changed, the analog-to-digital converter outputs data to exterior in as many bits as with its maximum resolution.

* * * * *